(12) United States Patent
Dairiki et al.

(10) Patent No.: US 7,666,772 B2
(45) Date of Patent: Feb. 23, 2010

(54) HEAT TREATMENT APPARATUS AND METHOD OF MANUFACTURING A SEMICONDUCTOR DEVICE

(75) Inventors: Koji Dairiki, Kanagawa (JP); Shunpei Yamazaki, Tokyo (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 230 days.

(21) Appl. No.: 11/652,094

(22) Filed: Jan. 11, 2007

(65) Prior Publication Data

US 2007/0117362 A1    May 24, 2007

Related U.S. Application Data

(62) Division of application No. 10/001,197, filed on Dec. 4, 2001, now Pat. No. 7,179,729.

(30) Foreign Application Priority Data

Dec. 5, 2000    (JP) .............................. 2000-370779

(51) Int. Cl.
H01L 21/26    (2006.01)
H01L 21/425    (2006.01)

(52) U.S. Cl. .................. 438/535; 438/487; 438/530

(58) Field of Classification Search ................ 438/487, 438/509, 530, 535
See application file for complete search history.

(56) References Cited

U.S. PATENT DOCUMENTS

| | | | |
|---|---|---|---|
| 3,612,939 A | 10/1971 | Rabinowitz | |
| 5,444,217 A | 8/1995 | Moore et al. | |
| 5,508,532 A | 4/1996 | Teramoto | |
| 5,529,937 A | 6/1996 | Zhang et al. | |
| 5,530,265 A | 6/1996 | Takemura | |

(Continued)

FOREIGN PATENT DOCUMENTS

EP    0 651 431 A2    5/1995

(Continued)

OTHER PUBLICATIONS

M. A. Crowder et al., "Low-Temperature Single-Crystal Si TFT's Fabricated on Si Film s Processed via Sequential Lateral Solidification," IEEE Electron Device Letters, vol. 19, No. 8, pp. 306-308, Aug. 1, 1998.

(Continued)

*Primary Examiner*—Zandra Smith
*Assistant Examiner*—Pamela E Perkins
(74) *Attorney, Agent, or Firm*—Nixon Peabody, LLP; Jeffrey L. Costellia

(57) ABSTRACT

A heat treatment apparatus which enables a heating process for a short time with high reproducibility in a manufacturing process of a MOS transistor manufactured using a semiconductor substrate, and a method of manufacturing a semiconductor device using the heat treatment apparatus are provided. The heat treatment apparatus of the present invention which enables the above heat treatment method is characterized by comprising: a light source; a power supply for turning the light source on and off in a pulse shape; a processing chamber in which the substrate can be irradiated with light from the light source; and a unit for supplying a coolant to the processing chamber and also increasing and decreasing the supply amount.

20 Claims, 13 Drawing Sheets

U.S. PATENT DOCUMENTS

| | | |
|---|---|---|
| 5,643,826 A | 7/1997 | Ohtani et al. |
| 5,648,277 A | 7/1997 | Zhang et al. |
| 5,654,203 A | 8/1997 | Ohtani et al. |
| 5,712,495 A | 1/1998 | Suzawa |
| 5,719,065 A | 2/1998 | Takemura et al. |
| 5,731,637 A | 3/1998 | Hori et al. |
| 5,739,549 A | 4/1998 | Takemura et al. |
| 5,754,260 A | 5/1998 | Ooi et al. |
| 5,923,962 A | 7/1999 | Ohtani et al. |
| 5,945,711 A | 8/1999 | Takemura et al. |
| 5,956,579 A | 9/1999 | Yamazaki et al. |
| 6,087,245 A | 7/2000 | Yamazaki et al. |
| 6,105,274 A | 8/2000 | Ballantine et al. |
| 6,140,166 A | 10/2000 | Ohtani et al. |
| 6,140,668 A | 10/2000 | Mei et al. |
| 6,143,630 A | 11/2000 | Tregilgas |
| 6,156,628 A | 12/2000 | Ohnuma et al. |
| 6,162,667 A | 12/2000 | Funai et al. |
| 6,187,616 B1 | 2/2001 | Gyoda |
| 6,201,585 B1 | 3/2001 | Takano et al. |
| 6,285,042 B1 | 9/2001 | Ohtani et al. |
| 6,306,694 B1 | 10/2001 | Yamazaki et al. |
| 6,333,493 B1 | 12/2001 | Sakurai et al. |
| 6,335,541 B1 | 1/2002 | Ohtani et al. |
| 6,342,322 B1 | 1/2002 | Kakinuma et al. |
| 6,482,704 B1 | 11/2002 | Amano et al. |
| 6,599,818 B2 | 7/2003 | Dairiki |
| 6,759,313 B2 | 7/2004 | Yamazaki et al. |
| 2001/0005019 A1 | 6/2001 | Ishikawa |
| 2001/0005606 A1 | 6/2001 | Tanaka et al. |
| 2001/0009283 A1 | 7/2001 | Arao et al. |
| 2001/0015441 A1 | 8/2001 | Kawasaki et al. |
| 2002/0053670 A1 | 5/2002 | Ohtani et al. |
| 2002/0068422 A1 | 6/2002 | Dairiki et al. |
| 2002/0084261 A1 | 7/2002 | Yamazaki |
| 2004/0077185 A1 | 4/2004 | Dairiki |
| 2004/0241967 A1 | 12/2004 | Yamazaki et al. |

FOREIGN PATENT DOCUMENTS

| | | |
|---|---|---|
| EP | 1 158 580 A2 | 11/2001 |
| JP | 07-183540 | 7/1995 |
| JP | 2000-234165 | 8/2000 |

OTHER PUBLICATIONS

G. Radnoczi et al., "Al Induced Crystallization of a-Si," *Journal of Applied Physics*, vol. 69, No. 9, pp. 6394-6399, May 1, 1991.

T. Tsutsui et al., "High Quantum Efficiency in Organic Light-Emitting Devices with Iridium-Complex as a Triplet Emissive Center," *Japanese Journal of Applied Physics*, vol. 38, Dec. 15, 1999, pp. L1502-L1504.

T. Tsutsui et al., "Electroluminescence in Organic Thin Films," reprinted from *Photochemical Processes in Organized Molecular Systems*, Proceedings of the Memorial Conference for the late Professor Shigeo Tazuke, Yokahama, Japan, Sep. 22-24, 1990, Elsevier Science Publishers B.V., Sep. 22, 1990, pp. 437-450.

M.A. Baldo et al., "Highly efficient phosphorescent emission from organic electroluminescent devices," *Nature*, vol. 395, Sep. 10, 1998, pp. 151-154.

M.A. Baldo et al., "Very high-efficiency green organic light-emitting devices based on electrophosphorescence," *Applied Physics Letters*, vol. 75, No. 1, Jul. 5, 1999, pp. 4-6.

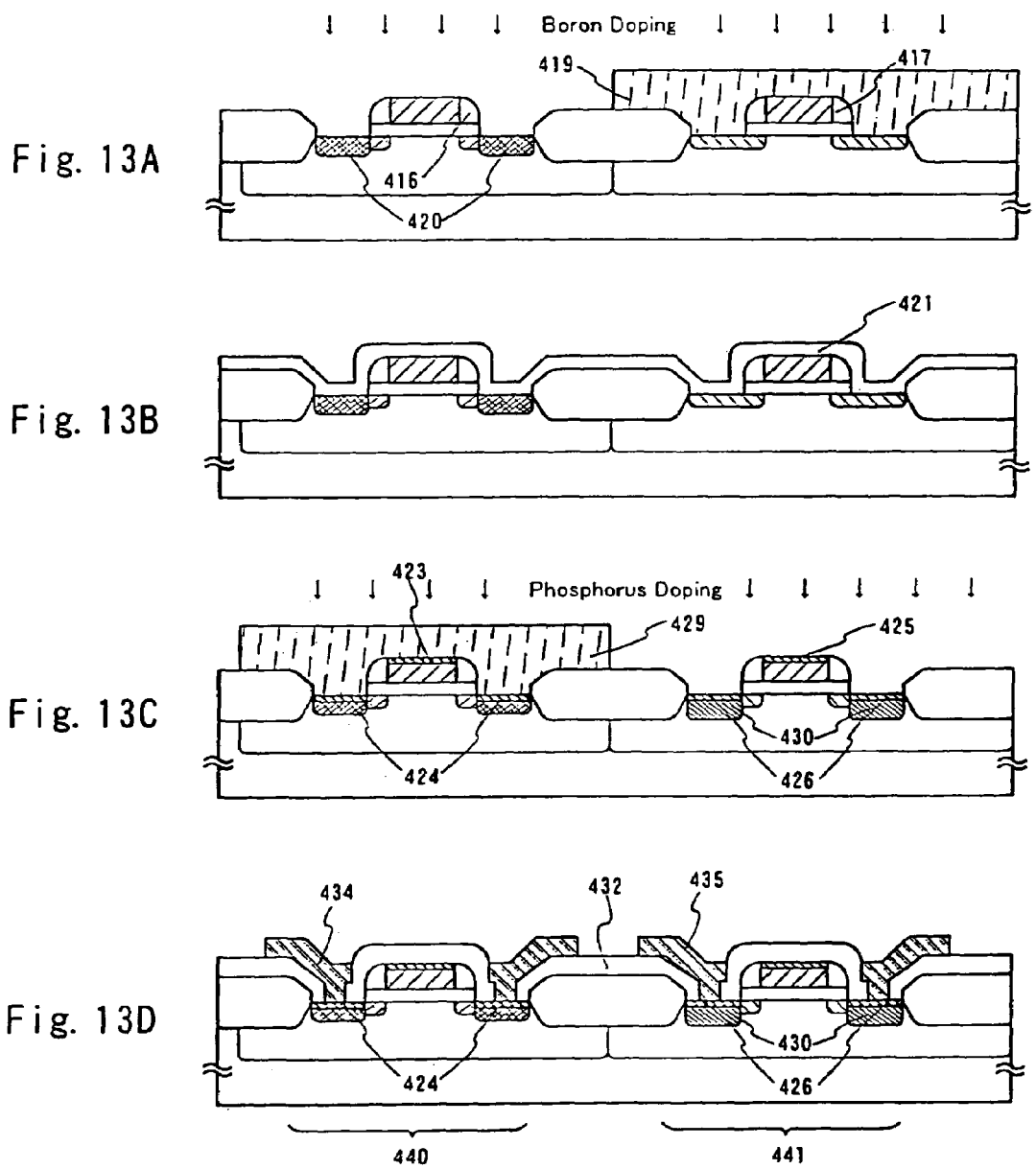

HEAT TREATMENT APPARATUS AND METHOD OF MANUFACTURING A SEMICONDUCTOR DEVICE

This application is a Divisional of Ser. No. 10/001,197 Filed Dec. 4, 2001, now U.S. Pat. No. 7,179,729 now Issued.

BACKGROUND OF THE INVENTION

1. Field of the Invention

The present invention relates to a heat treatment apparatus using a rapid thermal annealing (hereinafter referred to as RTA) method, and to a method of manufacturing a semiconductor device using the heat treatment apparatus. In particular, the present invention relates to a heat treatment apparatus that is used in an annealing process conducted for activation after ion injection.

2. Description of the Related Art

In a manufacturing process of a semiconductor integrated circuit, heat treatment is an essential process for the activation of an impurity after ion injection and for the formation of a contact of an electrode. The RTA method is known as a heat treatment technique that is conducted by instantaneously applying heat for several to several tens of seconds. The RTA method is one in which a substrate is rapidly heated mainly using a halogen lamp or the like, and has a characteristic that it is possible to raise or lower a temperature for a very short time in comparison with the case of using an annealing furnace.

As miniaturization of an integrated circuit progresses, the formation of a layer with a relatively low heat-resistant temperature is increasing. For example, a gate of a transistor is metalized. The activation of the impurity after ion injection in a semiconductor is performed after the formation of the gate, and thus, a heating process for activation is desirably conducted at a low temperature and for a short time. Further, there is a request for formation of a shallow junction with miniaturization. In this case as well, it is considered that the RTA method is suitable for conducting the heating process for a short time while suppressing diffusion of the impurity.

A conventional RTA apparatus has a structure in which a semiconductor substrate is placed in a chamber made of quartz and heated by using the RTA apparatus as a heating means. A light source such as a halogen lamp is used as the heating means, and the semiconductor substrate is heated by radiation from the light source. The heating temperature is possible to reach approximately 1100° C., and can be raised for several to several tens of seconds. A nitrogen gas is flown through the chamber formed of quartz.

In the RTA method, the heating process is conducted with a steep temperature change for a very short time of several to several tens of seconds, and thus, the diffusion of the impurity due to heat can be suppressed. However, to the contrary, a temperature profile for rise and lowering of temperature is important, and a small difference of temperature susceptibly influences an annealing characteristic. Thus, the heating process with reproducibility has been difficult to be conducted.

It is considered that a holding time in a maximum temperature region is made long in order to enhance reproducibility. However, since the gate formed of a metal with low heat-resistance is deteriorated, such a step is impossible. Further, the ratio of absorption of radiation from the light source differs between a portion where a metal wiring is formed and a portion where a metal wiring is not formed in the semiconductor substrate. Thus, there has been a problem in that the substrate is distorted and cracked due to thermal stress and other problems.

SUMMARY OF THE INVENTION

The present invention has been made to solve the above problems, and an object of the present invention is therefore to provide a technique in which a heating process with high reproducibility can be conducted for a short time.

As a means for solving the above problems, a heat treatment apparatus according to the present invention is described with reference to FIG. 7. FIG. 7 is a diagram showing a structure of the heat treatment apparatus of the present invention, and a processing chamber 701 is preferably formed by using quartz for a wall material. A halogen lamp, a metal halide lamp, a high-pressure mercury-vapor lamp, a high-pressure sodium-vapor lamp, a xenon lamp or the like is applied to a light source 702 as a means for heating a semiconductor substrate 707. In any case, it is desirable that the light source has energy of 1.1 eV or more. The light source 702 is provided outside the processing chamber 701, and is provided with a reflecting plate 703 for effectively irradiating a subject substrate with radiation heat. Although the case where the light source 702 is provided on only one side of the semiconductor substrate 707 is shown, the semiconductor substrate 707 may be irradiated from both the surfaces, of course.

Further, a coolant introduction port 704 is provided for cooling the semiconductor substrate 707 so that a coolant 705 is introduced into the processing chamber. A coolant exhaust port 706 is provided at one end of the processing chamber 701 so that the coolant 705 is exhausted. An inert gas such as nitrogen, helium, argon, krypton or xenon is used as the coolant 705, and in particular, helium (He) with high thermal conductivity is preferably used. Alternatively, liquid may be used. An inflow of the coolant 705 is adjusted in synchronization with on/off of the light source 702, whereby the temperature rise of the subject substrate itself is prevented. The coolant 705 may be circulated by interposing a means for maintaining a uniform temperature.

The light source 702 is turned on in a pulse shape by a power supply thereof and a control circuit. FIG. 8 is a diagram explaining a semiconductor substrate heated by the light source and a method of controlling a flow rate of the coolant flown through the processing chamber. At first, the substrate to be processed at a room temperature is rapidly heated by radiation from the light source. In a temperature rising period, the substrate is heated up to a set temperature (for example, 1100° C.) at a temperature rising rate of 100 to 300° C./sec. For example, if heated at a temperature rising rate of 150° C./sec, the substrate can be heated up to 1100° C. for a little under 7 seconds. Thereafter, the substrate is kept at the set temperature for a given period of time and turning-on of the light source is stopped. A holding time is set to 0.5 to 5 seconds. Therefore, a continuous turn-on period of the light source is 0.1 second or more, and does not exceed 20 seconds. The flow rate of the coolant is decreased with turning-on of the light source, and the flow rate is increased after the turning-on of the light source is stopped. The control of the flow rate at this time enables the control of a temperature-lowering rate. The temperature-lowering rate is set to 50 to 150° C./sec. For example, if cooled at a rate of 100° C./sec, the substrate can be cooled from 1100° C. to 300° C. for 8 seconds.

The present invention is characterized in that a cycle of heating by the light source 702 and cooling by circulation of the coolant 705 is repeated plural times. This is called PPTA (plural pulse thermal annealing). In the PPTA, an actual heating time is shortened, and also, light selectively absorbed to the semiconductor substrate is irradiated from a lamp light source. The pulse light shown in FIG. 8 heats the semiconductor substrate, heating is stopped before the heat causes damage to a layer with low heat-resistance, and also, the semiconductor substrate is cooled from the periphery thereof by the coolant, whereby considerable thermal damage is prevented from being caused to the layer with low heat-resistance. Therefore, deformation of the substrate, which has been regarded as a problem in a conventional RTA apparatus, can be prevented.

Further, the PPTA is conducted under the reduced pressure of 13.3 Pa or less in the processing chamber, whereby oxidization or contamination of the surface of the semiconductor substrate can be prevented. On the other hand, if the PPTA is conducted under the reduced pressure of 13.3 Pa or more, a cooling effect of the semiconductor substrate can be enhanced. Thus, deterioration of the layer with low heat-resistance, such as a wiring formed by using aluminum, can be prevented.

A turn-on time period per time of lightening by the light source 702 is 0.1 to 60 seconds, preferably 0.1 to 20 seconds, and light from the light source is irradiated plural times. Alternatively, the light from the light source is irradiated in a pulse shape such that a time period for holding the maximum temperature of the semiconductor substrate is 0.5 to 5 seconds. Further, a supply amount of the coolant 705 is increased or decreased with turning-on/turning-off of the light source 702. Thus, heat treatment effect of the semiconductor substrate is enhanced, and also, the thermal damage on the layer with low heat-resistance, which is formed on the semiconductor substrate, is prevented.

The heat treatment apparatus of the present invention which enables the above-described heat treatment method is characterized by comprising the light source, the power supply for turning the light source on and off in a pulse shape, the processing chamber in which the substrate can be irradiated with the light from the light source and the means for supplying the coolant to the processing chamber and increasing or decreasing the supply amount.

Further, a method of manufacturing a semiconductor device according to the present invention includes a process of heating a semiconductor substrate for a short time, the heating process includes a step of introducing a coolant into a processing chamber in which the semiconductor substrate is placed, and the semiconductor substrate is irradiated with light from a light source plural times with an emission time period per time of lightening by the light source of 0.1 to 20 seconds in the heating process. In the heating process, the coolant is flown through the processing chamber, a supply amount of the coolant is decreased with turning-on of the light source, the light source is turned off, and at the same time, a process of increasing the supply amount of the coolant as one cycle may be repeated plural times. Such a heating process can be conducted after an impurity of one conductivity type is added by an ion injection method.

BRIEF DESCRIPTION OF THE DRAWINGS

In the accompanying drawings:

FIGS. 13A to 13D are diagrams explaining the manufacturing process of the MOS transistor.

DETAILED DESCRIPTION OF THE PREFERRED EMBODIMENTS

Figure 1:
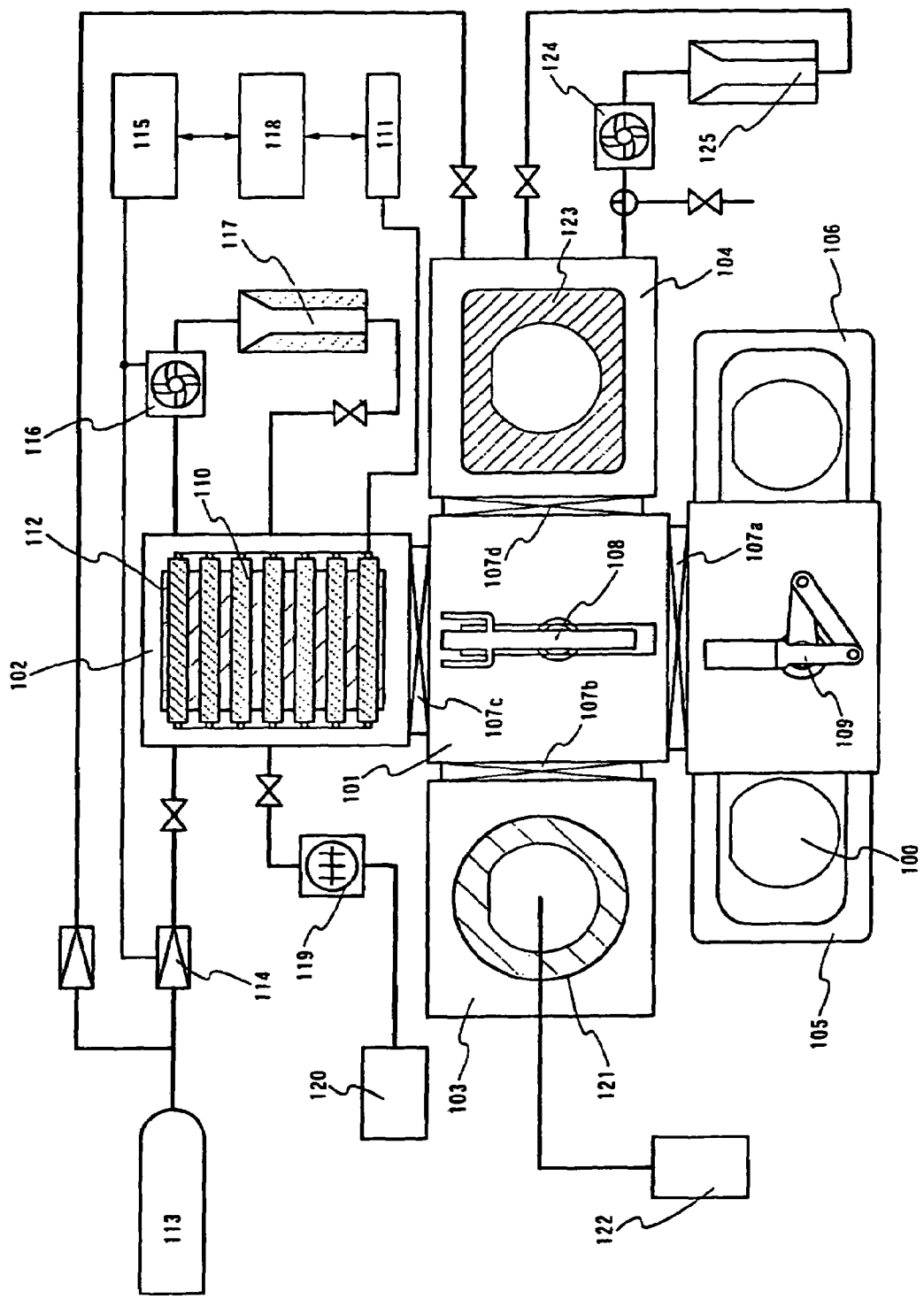
FIG. 1 is a diagram explaining a structure of a heat treatment apparatus of the present invention.

Hereinafter, an embodiment mode of the present invention is described in detail with reference to the accompanying drawings. A structure of a heat treatment apparatus of the present invention is described with reference to FIG. 1. The heat treatment apparatus shown in FIG. 1 has a structure in which a heat treatment chamber 102, a surface processing chamber 103, a cooling chamber 104, a load chamber 105 and an unload chamber 106 are provided in the periphery of a transfer chamber 101 provided with a transfer means 108 for transferring a semiconductor substrate 100. The respective chambers are partitioned by gates 107a to 107d. Further, a transfer of the substrate from the load chamber 105 to the transfer chamber 101 and a transfer of the semiconductor substrate from the common chamber 101 to the unload chamber 106 are conducted by a transfer means 109.

The heat treatment chamber 102 is provided with a light source 110 and a substrate stage 112. Further, in order to decompress the inside of the heat treatment chamber 102, a turbo molecular pump 119 and a dry pump 120 as exhaust means are connected to the heat treatment chamber 102. Of course, other vacuum pumps may be used as the exhaust means.

Nitrogen, inert gas or liquid may be used as a coolant introduced into the heat treatment chamber 102. In any case, a medium that hardly absorbs radiation of the light source 110 is desirably used as the coolant. Helium (He) is used here and is supplied from a cylinder 113 through a flow rate control means 114. He supplied to the heat treatment chamber 102 is circulated by a circulator 116 to cool the semiconductor substrate. In this case, it is desirable that a refining device 117 is provided on the midway in order to maintain the purity of He. A getter material, a cold trap due to liquid nitrogen or the like may be used for the refining device 117.

Figure 8:
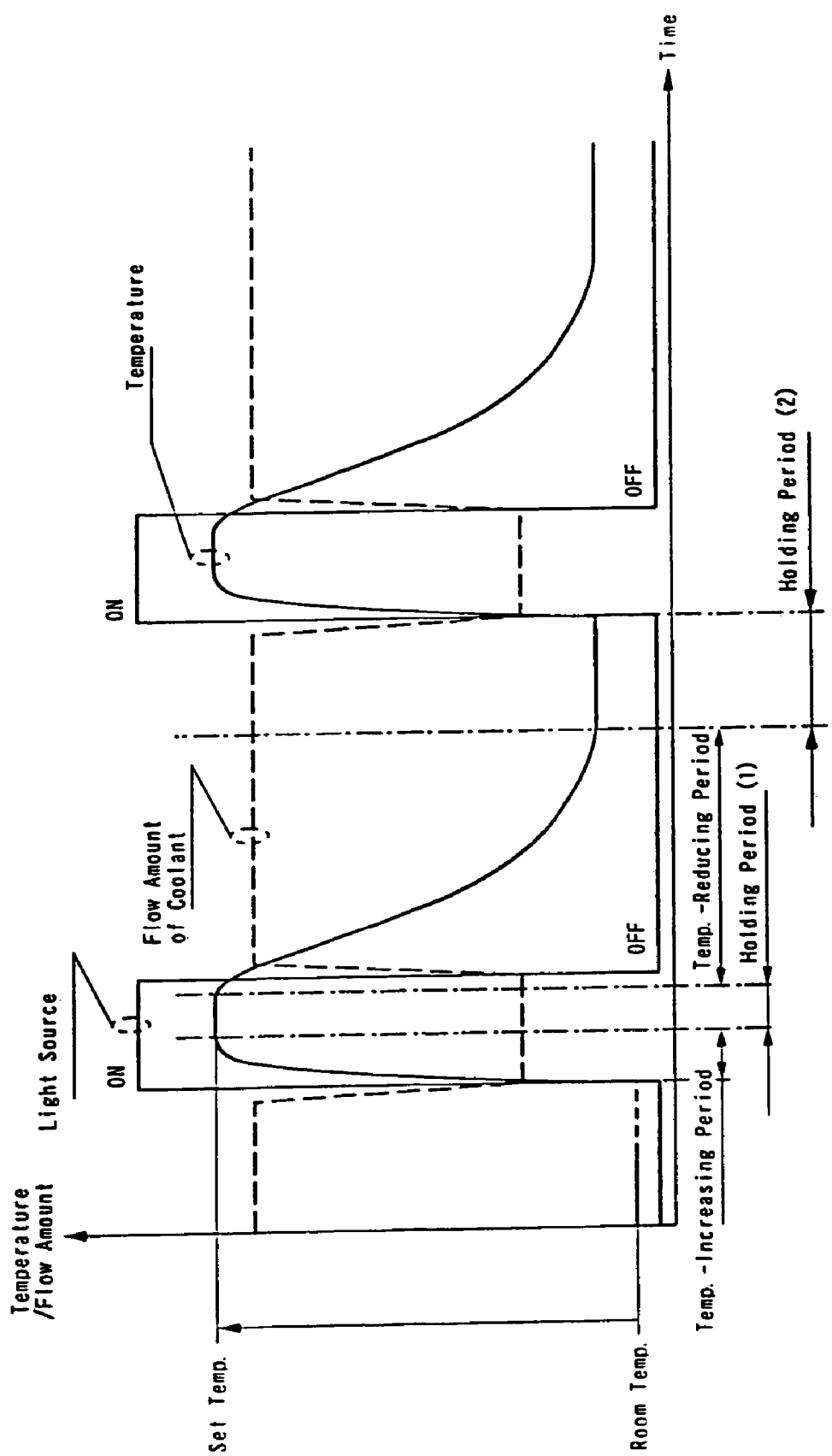
FIG. 8 is a diagram explaining turning-on/turning-off of a light source, a temperature change of the semiconductor substrate, and a method of supplying a coolant.

The light source 110 is turned on in a pulse shape by a power supply 111 thereof. As described in FIG. 8, the turning-on and turning-off of the light source 110 and the flow rate of He that is made to flow through the heat treatment chamber 102 are changed in connection with each other. The substrate to be processed is rapidly heated by the turning-on of the light source 110. In a temperature rising period, the substrate is heated up to a set temperature (for example, 1100° C.) with a temperature rising rate of 100 to 200° C./sec. The set temperature is a temperature that is detected by a temperature detection means provided in the vicinity of the substrate to be processed. A thermopile or a thermocouple is used as the temperature detection means.

For example, if heated at a temperature rising rate of 150° C./sec, the substrate can be heated to 1100° C. for a little under 7 seconds. Thereafter, the substrate is kept at the set temperature for a given period of time and the turning-on of the light source is stopped. A holding time period is 0.5 to 5 seconds. Therefore, a continuous turning-on period of the lamp light source is 0.1 second or more, and does not exceed 60 seconds. The flow rate of He is decreased with the turning-on of the light source 110, and the flow rate is increased after the turning-on of the light source 110 is stopped. The control of the flow rate at this time enables the control of a temperature-lowering rate. The temperature-lowering rate is set to 50 to 150° C./sec. For example, if cooled at a rate of 100° C./sec, the substrate can be cooled from 1100° C. to 300° C. for 8 seconds. In order to attain the above-described control, the power supply 111 of the light source 110 and a controller 115 of the flow rate control means 114 and the circulator 116 are controlled by a computer 118.

As described above, the heat treatment apparatus of the present invention is characterized in that a cycle of heating and cooling is repeatedly conducted plural times. An actual heating time is shortened, and also light selectively absorbed to the semiconductor substrate is irradiated from the light source, whereby selective heating is enabled.

Figure 14:
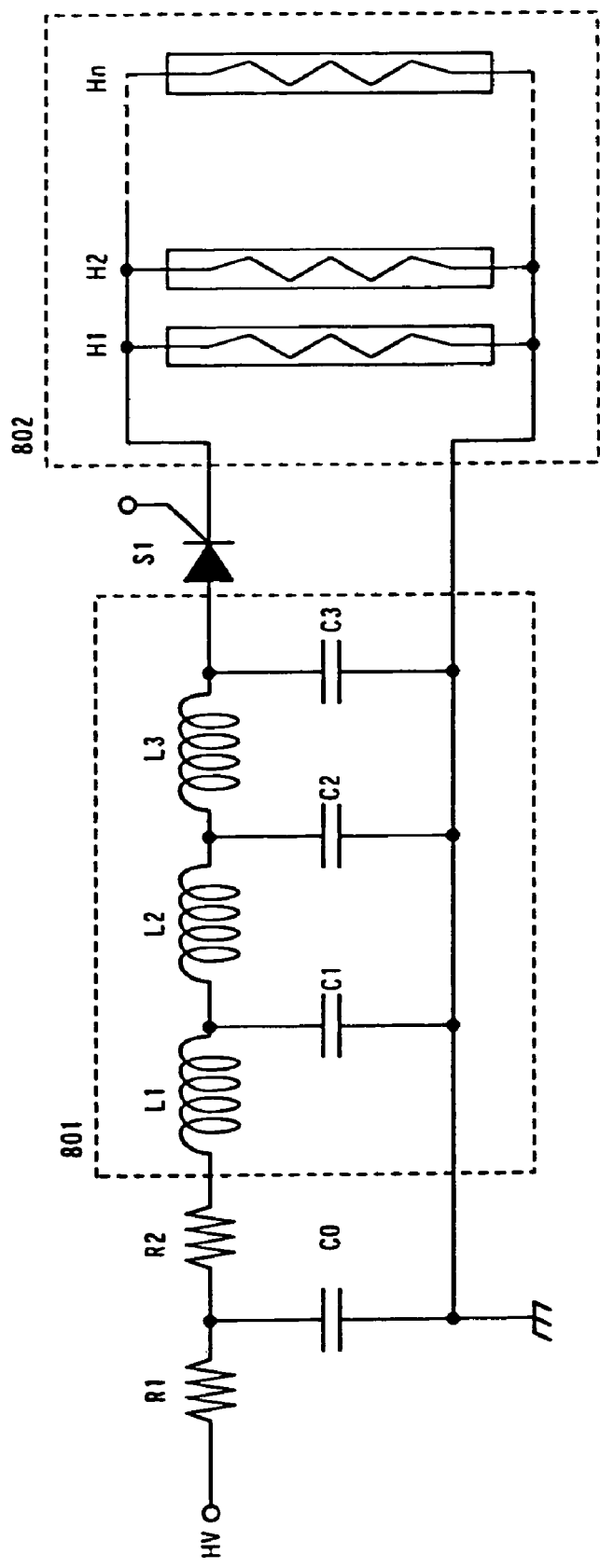
FIG. 14 is a diagram illustrating an example of a control circuit which is provided with a light source such as a halogen lamp and is suitable for turning the light source on and off in a pulse shape.

A circuit that enables a discharge in a pulse shape by using a light source such as a halogen lamp is shown in FIG. 14. Reference numeral 802 indicates the light source, in which halogen lamps H1 to Hn are connected in parallel. Reference symbol S1 indicates a switch formed using a thyristor or the like. Reference numeral 801 indicates a PFL (pulse forming line) circuit in which coils L1 to L3 are connected in series and capacitors C1 to C3 are connected in parallel, and the PFL circuit is one for forming a high voltage pulse waveform that maintains a peak voltage for a given period of time When a high voltage HV is applied, the respective capacitors are charged, and when S1 is turned on, a discharge voltage is applied to light sources H1 to Hn. Since the coils are connected at this time, the waveform becomes dull by a time constant and a series-parallel circuit of the coils and the capacitors, and thus, a discharge waveform can be formed with the duration of several microseconds to several seconds. The duration of the discharge can be varied in accordance with values of L and C or the number of stages of connection.

The cooling chamber 104 is a chamber for temporarily storing the substrate to be processed, which has been subjected to the heat treatment, and is provided with a substrate stage 123. Further, He as a coolant is supplied to the cooling chamber 104 from the cylinder 113, and the coolant can be circulated by a circulator 124 and a refining device 125 as in the heat treatment chamber.

In the surface processing chamber 103, washing of the substrate to be processed is conducted by a wet process. As one example of the process conducted in the surface processing chamber 103, washing with a water solution containing ozone or washing with etching of an oxide film by using rare hydrofluoric acid can be conducted as a surface process of the semiconductor substrate.

Figure 2:
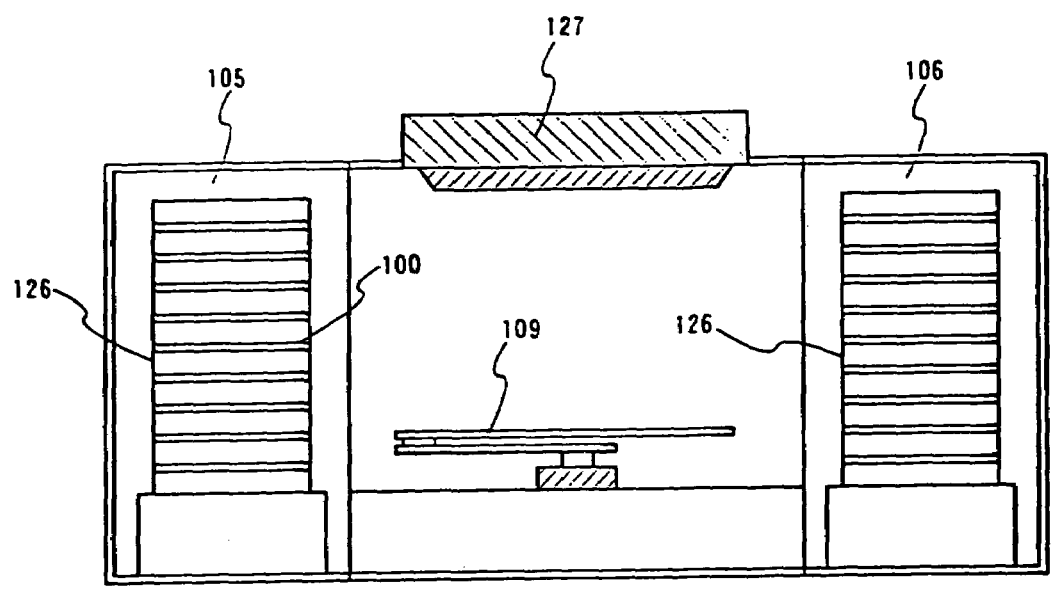
FIG. 2 is a diagram explaining a structure of a heat treatment apparatus of the present invention.

FIG. 2 is a cross sectional view explaining the structure of the load chamber 105 and the unload chamber 106. A cassette 126 for storing the semiconductor substrate 100 is provided in each of the load chamber 105 and the unload chamber 106, and bringing in the substrate and carrying out the substrate are conducted by the transfer means 109. Further, a HEPA filter is provided in the structure, a blower 127 for blowing clean air is provided in the above portion, and it is preferable that attention is paid on such that dust does not attach to the semiconductor substrate during transfer.

Figure 3:
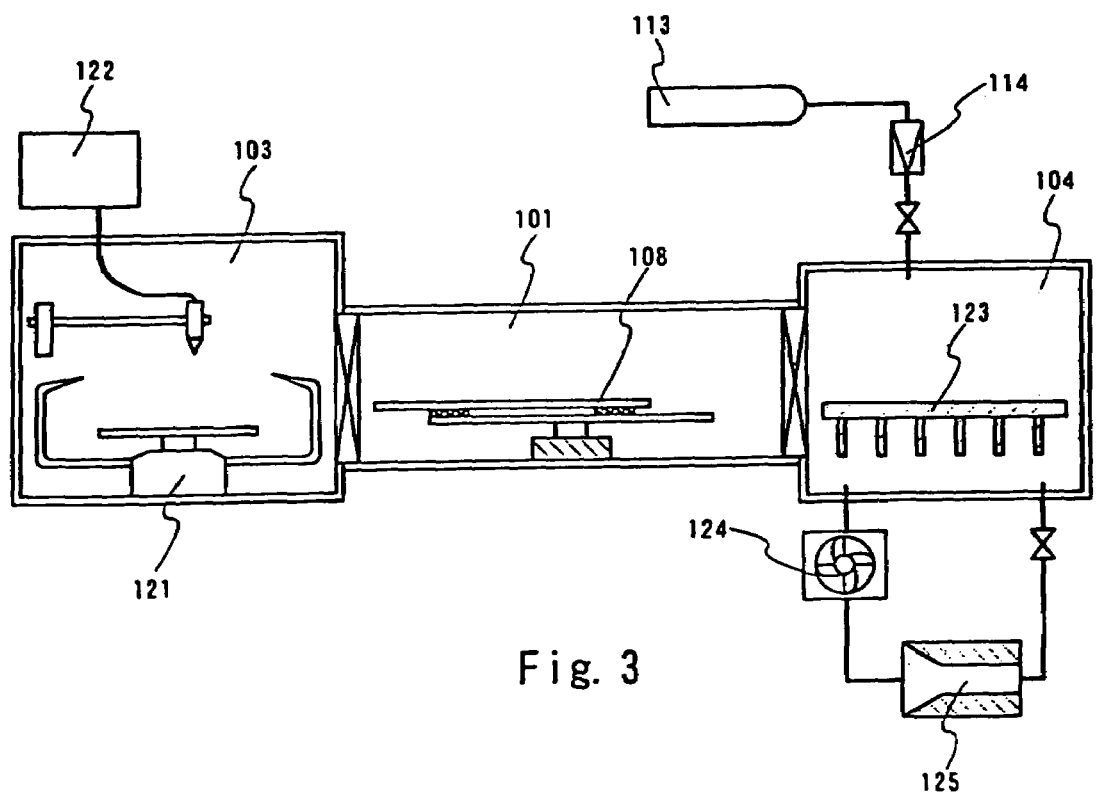
FIG. 3 is a diagram explaining a structure of the heat treatment apparatus of the present invention.

FIG. 3 is a cross sectional view showing the structure of the surface processing chamber 103 and the cooling chamber 104, which are provided on both sides of the transfer chamber 101 provided with the transfer means 108 through the gates 107b and 107d, respectively. The surface processing chamber 103 is provided with a spinner 121 for fixing and rotating the semiconductor substrate and a pipettor 122 for applying a liquid medicine. The cooling chamber 104 is provided with the substrate stage 123 and is provided with the cylinder 113 and the flow rate control means 114 for supplying He as one example of a coolant. Further, the circulator 124 and the refining device 125 for circulating the coolant are provided.

Figure 4:
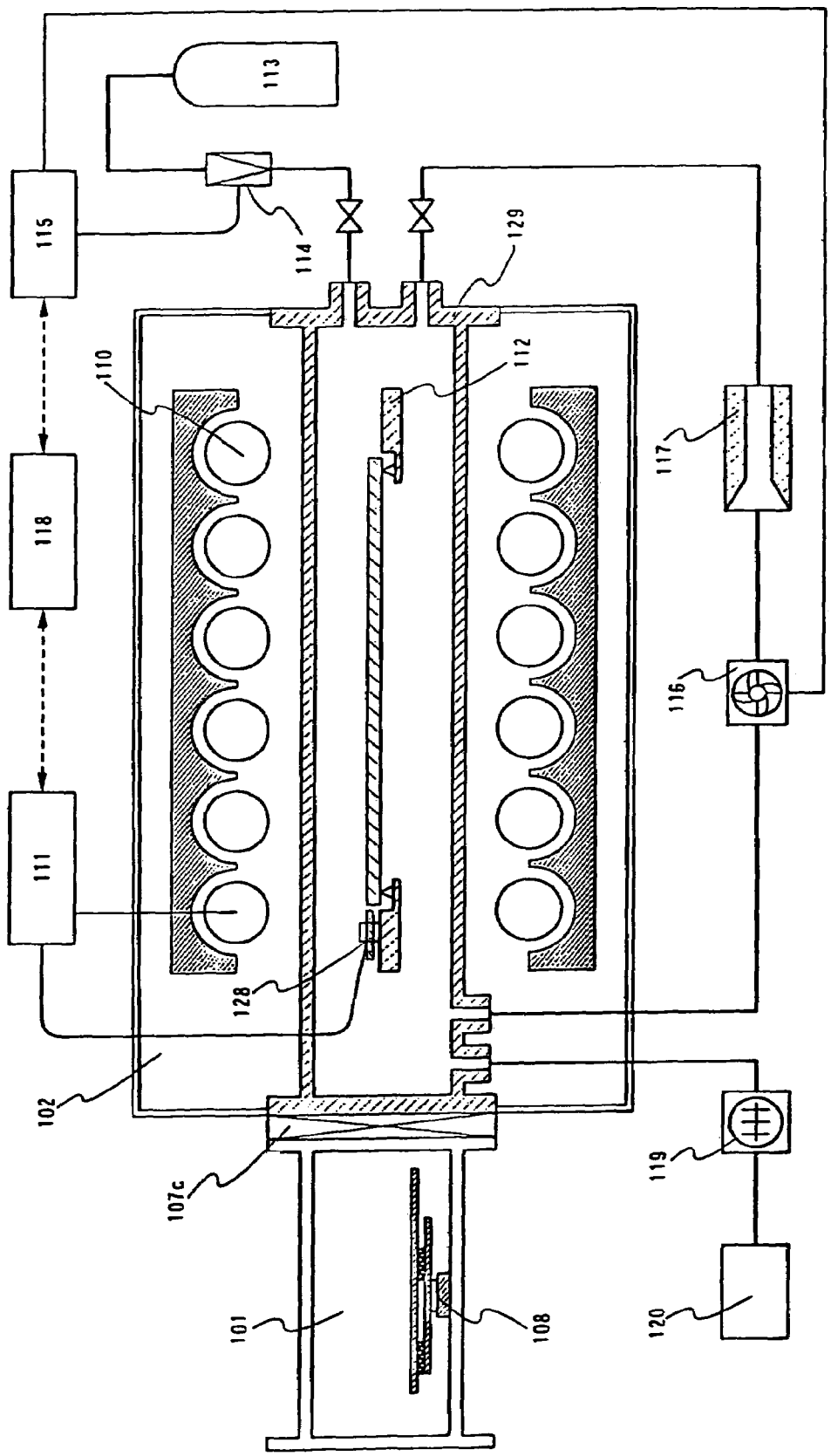
FIG. 4 is a diagram explaining a structure of the heat treatment apparatus of the present invention.
Figure 5:
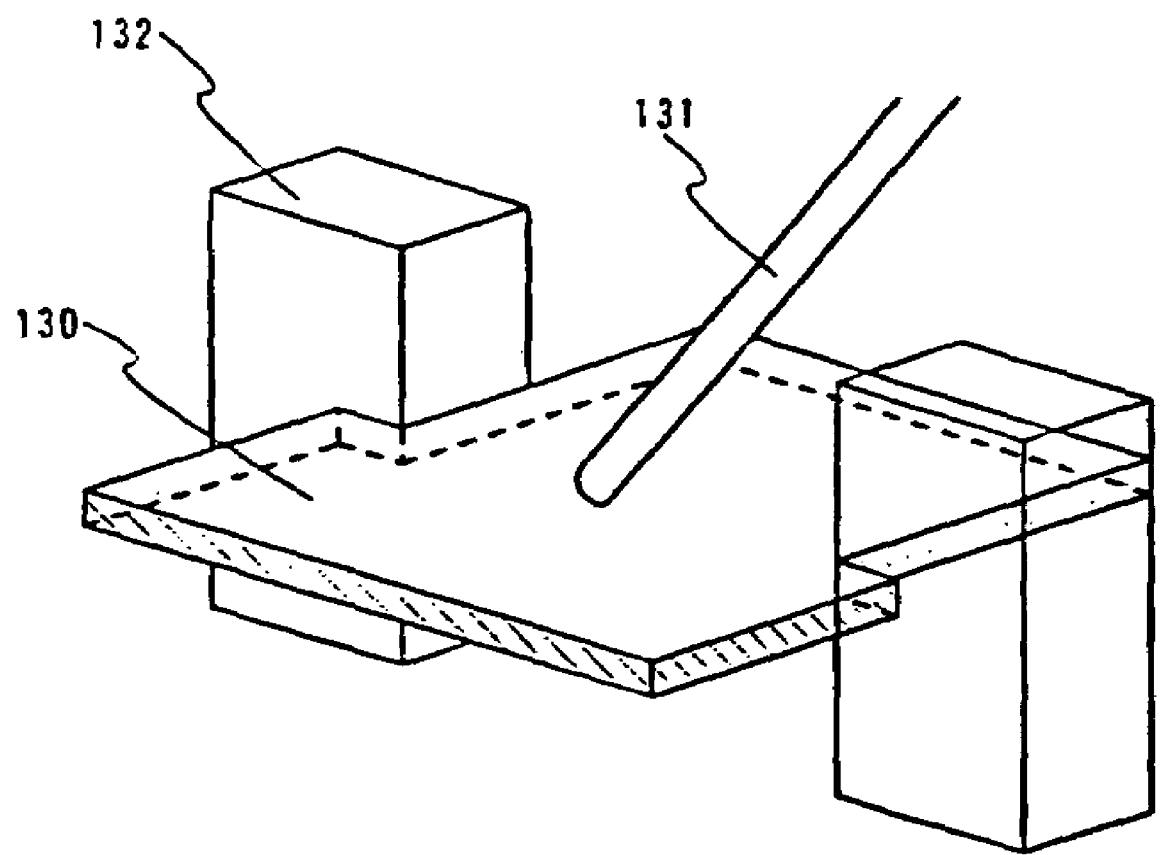
FIG. 5 is a diagram explaining a structure of a temperature detection means provided in the vicinity of a semiconductor substrate.

FIG. 4 is a diagram explaining the heat treatment chamber 102 in detail. A reaction chamber 129 formed of quartz is provided in the heat treatment chamber 102, and the light source 110 is provided outside the reaction chamber 129. The substrate holder 112 formed of quartz is provided in the reaction chamber 129, and the semiconductor substrate is provided on the substrate holder 112. At this time, the substrate to be processed is put on pins in order to make a temperature distribution uniform. Further, as a means for monitoring a temperature heated by the light source 110, a temperature detection system 128 using a thermocouple is adopted here. The details are shown in FIG. 5. A thermocouple 131 is put to a member 130 (silicon here) that is preferably formed of the same material as that for an object to be heated to thereby indirectly detect the temperature heated by the light source 110. The member 130 is provided on the substrate stage in a floating manner by a fixing stand 132.

The light source 110 conducts operation of turning-on and turning-off by the power supply 111. The computer 118 controls the operations of the power supply and the flow rate control means 114.

The coolant introduced into the reaction chamber 129 may be operated by being circulated by the circulator 116. It is important that the purity of He as the coolant is maintained by providing the refining device 117 in the circulation path.

Further, the turbo molecular pump 119 and the dry pump 120 are provided as exhaust means for enabling the heating process under the reduced pressure. In the heating process under the reduced pressure, a wavelength band in which radiation from the light source is absorbed to the semiconductor substrate is used, whereby the semiconductor substrate may be heated. In the heating process under the reduced pressure, oxidization of the surface of the semiconductor substrate is suppressed by reduction of an oxygen concentration. As a result, activation is promoted, and the heating process with high reproducibility can be performed.

The substrate to be processed is firstly set in the transfer chamber 101 connected to the heat treatment chamber 102 through the gate 107c, and is set on the substrate stage 112 by the transfer means 108.

Figure 6:
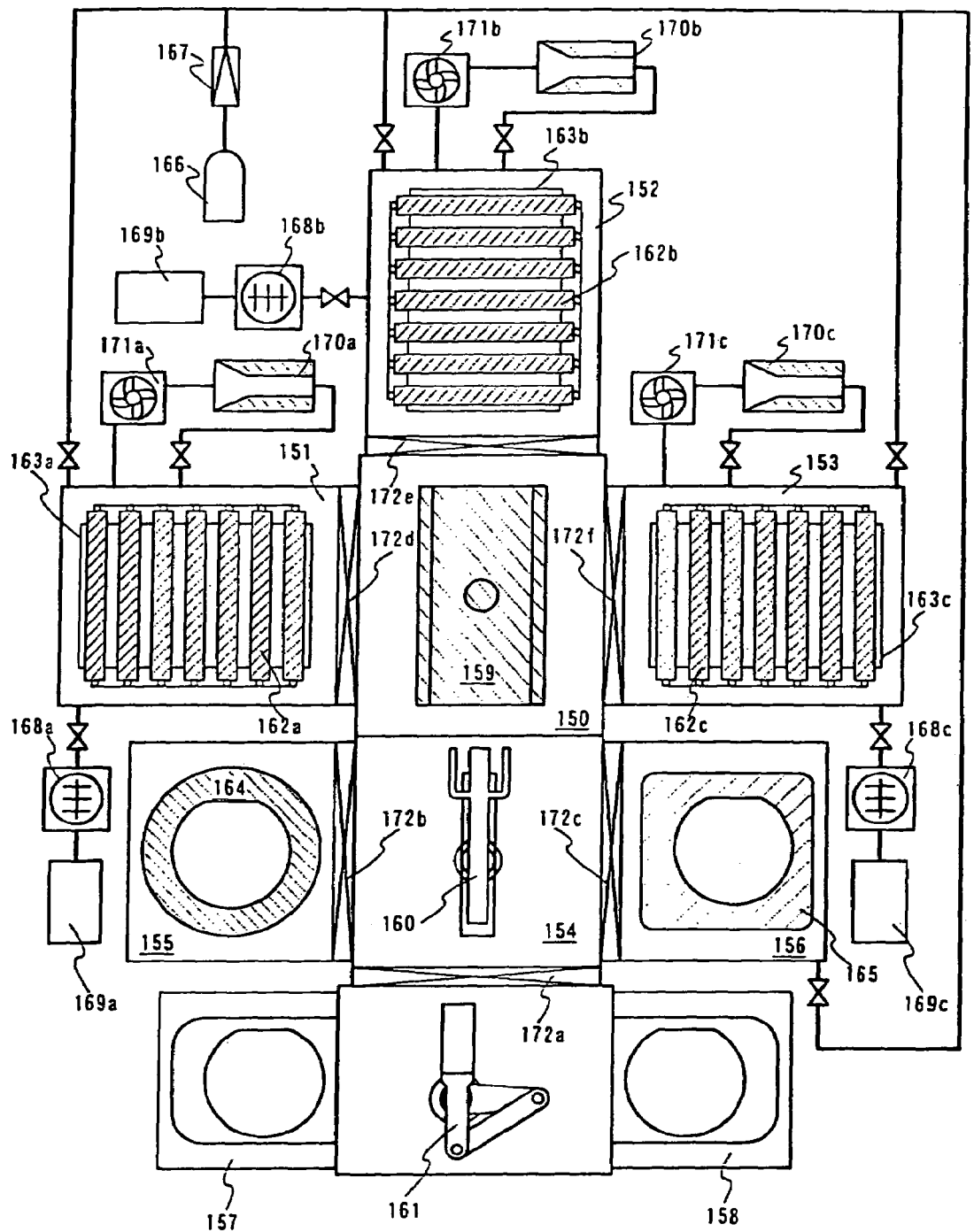
FIG. 6 is a diagram explaining a structure of a multi-task type heat treatment apparatus according to the present invention.
Figure 7:
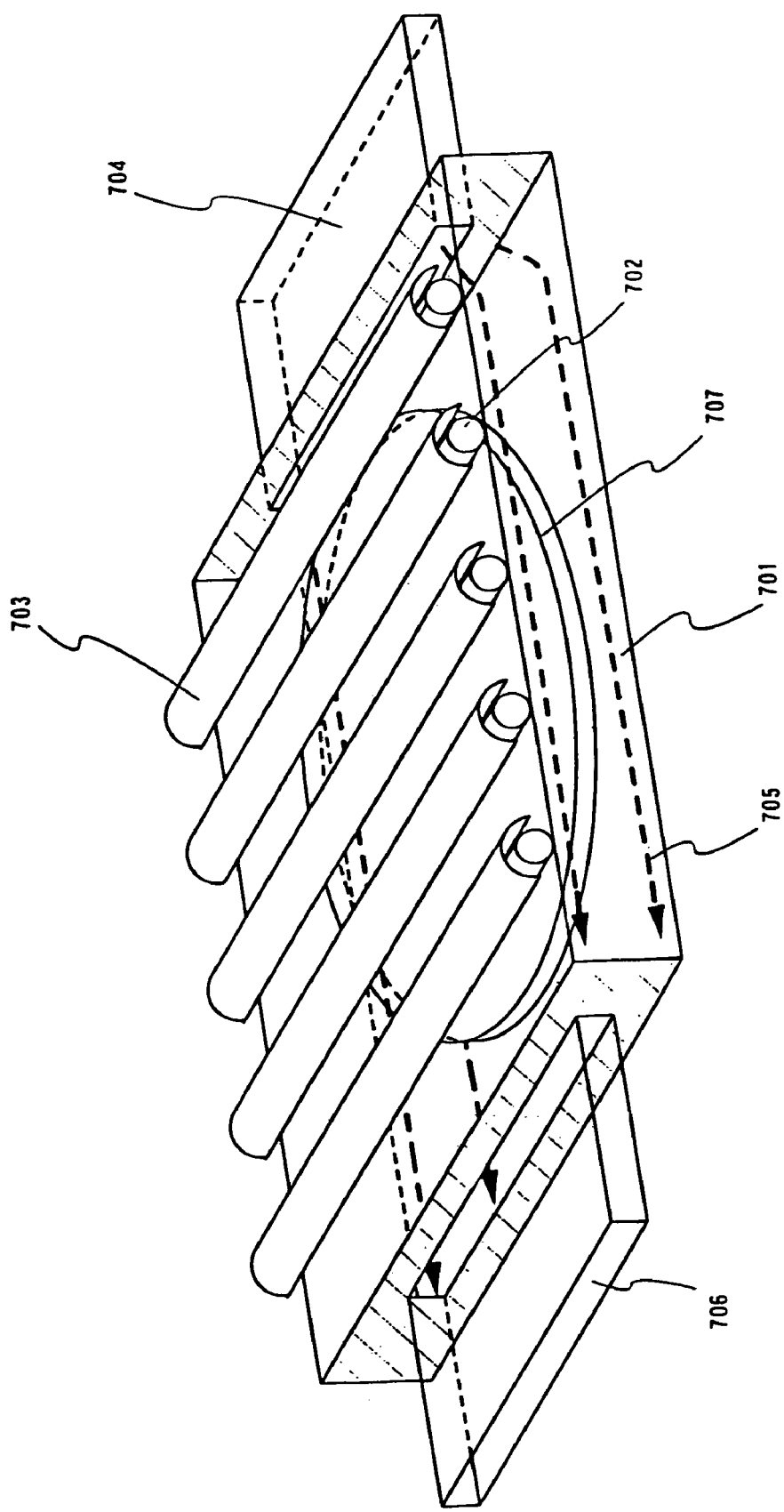
FIG. 7 is a diagram explaining a concept of the heat treatment apparatus of the present invention.

A multi-task structure provided with a plurality of heat treatment chambers in the heat treatment apparatus with the above-mentioned structure is shown in FIG. 6. In the structure of FIG. 6, a first heat treatment chamber 151, a second heat treatment chamber 152 and a third heat treatment chamber 153 are provided in the periphery of a first transfer chamber 150 in a connection state through gates 172d to 172f. The structures of the heat treatment chambers are the same as the structure in FIG. 4. A coolant is introduced into the respective heat treatment chambers from a cylinder 166 through a flow rate control means 167. Turbo molecular pumps 168a to 168c and dry pumps 169a to 169c constitute exhaust means for decompressing the inside of the processing chamber. Further, circulators 171a to 171c for circulating the coolant and refining devices 170a to 170c for refining the coolant are provided. Although not shown in the figure, turning-on/turning-off of the light source, supply of the coolant and the like are controlled by a computer.

A second transfer chamber 154 is provided with a transfer means 160, which is one for conducting a transfer of the substrate to be processed to the first processing chamber 150, a surface processing chamber 155 and a cooling chamber 156. The surface processing chamber 155 is provided with a spinner 164. Further, the cooling chamber 156 is provided with a substrate stage 165. The structure of a load chamber 157 and an unload chamber 158 is the same as that shown in FIG. 2, and a transfer of the semiconductor substrate is conducted by a transfer means 161.

From the above, according to the present invention, the heating process for a short time with the purpose of activating impurity elements added to the semiconductor substrate and improving contact resistance of an electrode is enabled. The structure of the heat treatment apparatus in the embodiment mode of the present invention is one example, and the present invention is not limited to the structure shown here. The heat treatment apparatus of the present invention is characterized by comprising the means for cooling the semiconductor substrate and the structure in which the semiconductor substrate is heated by irradiation of light from the light source in a pulse shape. As long as the above-mentioned structure is satisfied, there is no particular limitation on other structures.

Embodiment 1

An embodiment of a method of conducting a heating process of a semiconductor device by using the heat treatment apparatus of the present invention, which has been described with reference to FIGS. 1 to 6, is described.

Figure 9:
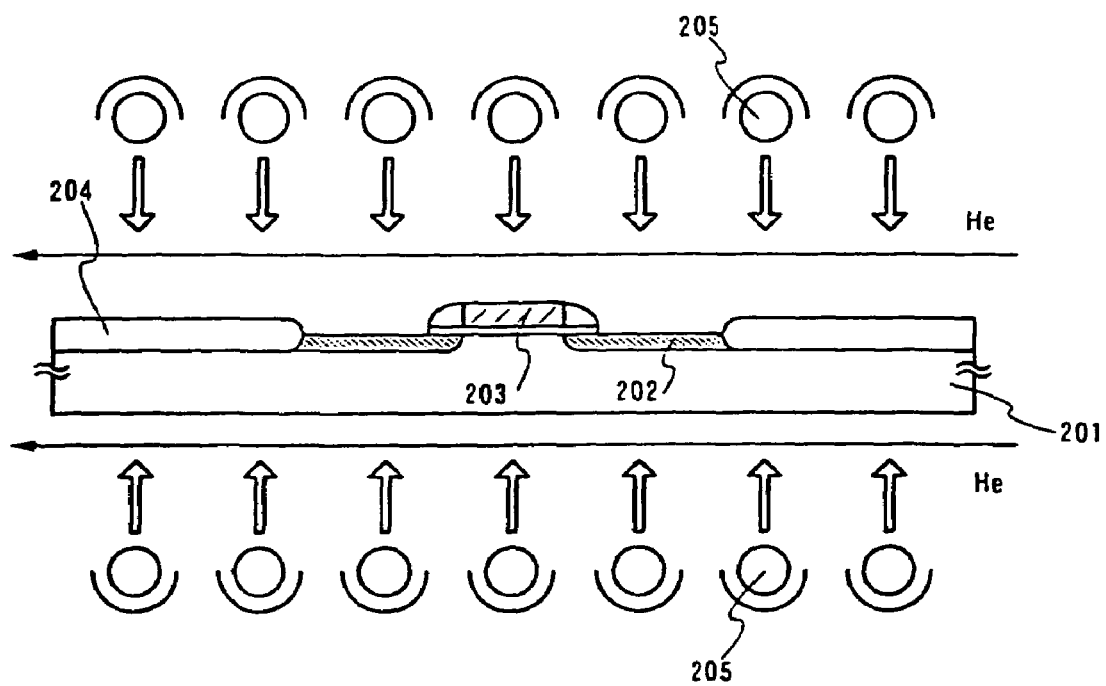
FIG. 9 is a diagram explaining a heat treatment method of the semiconductor substrate in accordance with the heat treatment apparatus of the present invention.

In FIG. 9, a field oxide film 204, impurity regions 202 formed by ion injection and a gate 203 are formed on a semiconductor substrate 201.

Here, the heating process for activation of the impurity regions 202 after the ion injection is shown. After the semiconductor substrate is brought into a processing chamber, vacuum exhaust is conducted to approximately 0.1 to 0.0001 Pa by an exhaust means. Then, He as a coolant is introduced. The pressure after the introduction of He is set to approximately 1 to 1000 Pa. Thereafter, as described in FIG. 8, pulse light is irradiated plural times to perform crystallization. The pulse light may be irradiated from one surface or both surfaces of the semiconductor substrate. The impurity regions can be activated to have low resistance by conducting irradiation of the pulse light plural times.

Of course, the activation may be conducted under an atmospheric pressure state with He as the coolant. However, the pressure is once made to be decompression, and the oxygen concentration remaining in the processing chamber is reduced to several ppm or less, whereby contamination due to the impurity is suppressed, and the heating process with high reproducibility can be conducted. Thus, an amorphous silicon film can be crystallized with a heating time period of substantially several seconds to several tens of seconds.

Embodiment 2

An example of a process of manufacturing a MOS transistor by using a manufacturing device according to the present invention is described.

Figure 10A:
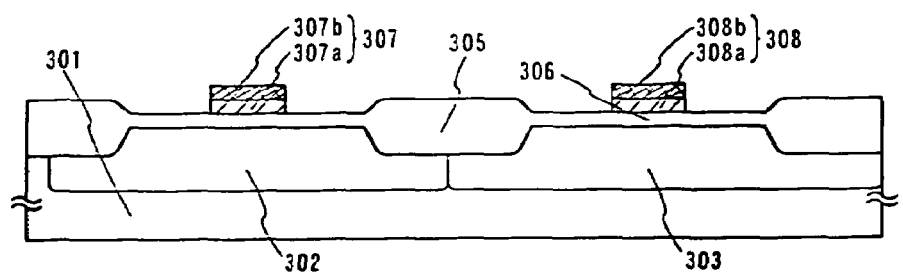
FIGS. 10A to 10C are diagrams explaining a manufacturing process of a MOS transistor.
Figure 10B:
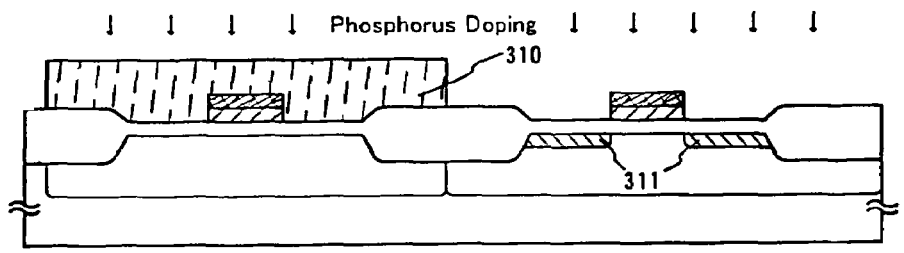
Figure 10C:
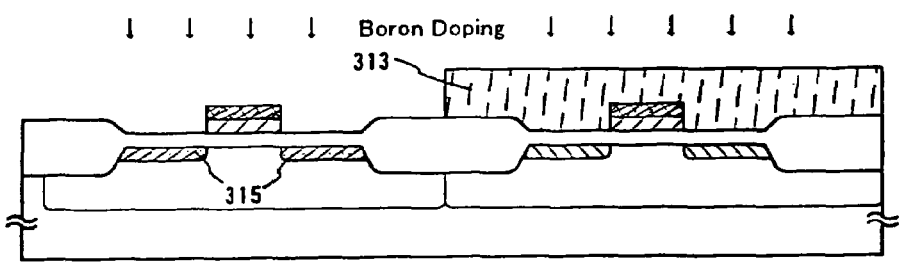

In FIGS. 10A to 10C, an n-well 302 and a p-well 303 are formed on a substrate 301 formed of single crystal silicon with relatively high resistance (for example, n type, approximately 10 Ωcm) with one mask in a self-aligning manner. Then, a field oxide film 305 is formed. At this time, boron (B) may be selectively introduced into the semiconductor substrate by an ion injection method to form a channel stopper. Then, a silicon oxide film 306 that becomes a gate insulating film is formed by a thermal oxidization method. Subsequently, a polycrystalline silicon film for a gate is formed with a thickness of 100 to 300 nm by a CVD method. Phosphorous (P) at a concentration of approximately $10^{21}/cm^3$ may be previously doped into the polycrystalline silicon film for a gate in order to make resistance lower. Alternatively, after the polycrystalline silicon film is formed, an n-type impurity at a high concentration may be diffused. Here, in order to further make the resistance lower, a silicide film with a thickness of 50 to 300 nm is formed on the polycrystalline silicon film. Molybdenum silicide (MoSix), tungsten silicide (WSix), tantalum silicide (TaSix), titanium silicide (TiSix) or the like may be applied to the silicide material, and the silicide film may be formed in accordance with a known method. Then, the polycrystalline silicon film and the silicide film are etched to form gates 307 and 308. The gates 307 and 308 have a double-layer structure of a polycrystalline silicon film 307a and a silicide film 307b and a double-layer structure of a polycrystalline silicon film 308a and a silicide film 308b, respectively (FIG. 10A).

Next, impurity elements imparting an n-type conductivity and a p-type conductivity, respectively, are added in order to form lightly-doped drain (LDD) regions in an n-channel MOS transistor and a p-channel MOS transistor. Here, phosphorous (P) is ion-implanted to the n-channel MOS transistor, and boron (B) is ion-implanted to the p-channel MOS transistor. The dose amount is set to $1\times10^{13}/cm^2$. By conducting ion injection while using the gates as masks, impurity regions 311 added with phosphorous (P) and impurity regions 315 added with boron (B) are formed in a region where the n-channel MOS transistor is formed and a region where the p-channel MOS transistor is formed, respectively, in a self-aligning manner (FIGS. 10B and 10C).

Figure 11A:
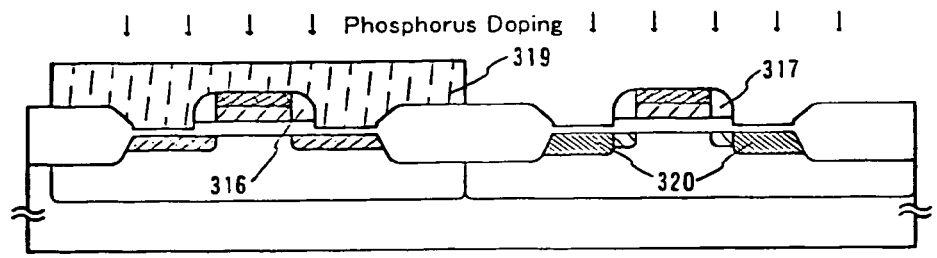
FIGS. 11A to 11C are diagrams explaining the manufacturing process of the MOS transistor.
Figure 11B:
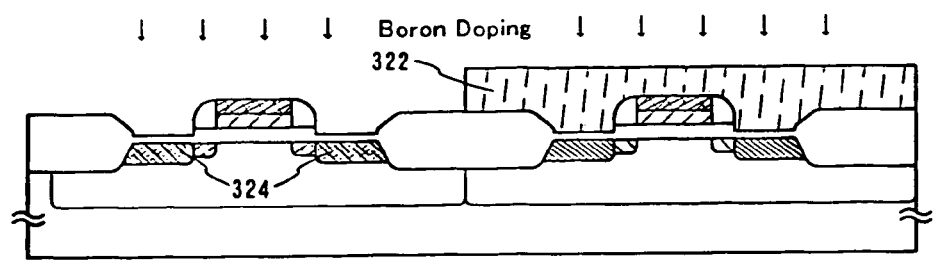
Figure 11C:
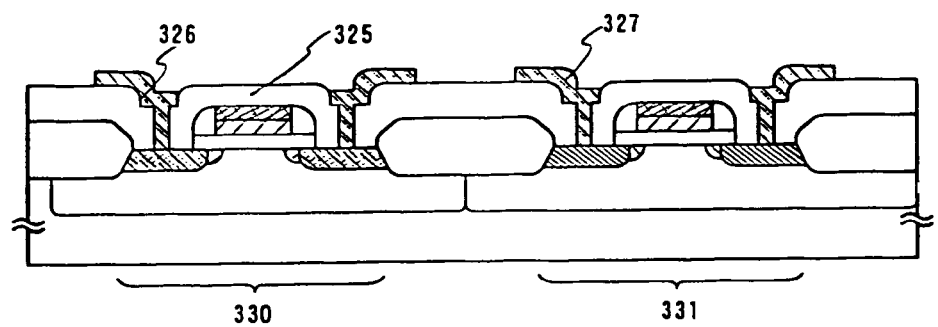

Thereafter, an insulating film such as a silicon oxide film or a silicon nitride film is formed over the entire surface by the CVD method, and etching is performed uniformly over the entire surface of the film by anisotropic dry etching. As a result, as shown in FIG. 11A, the insulating film remains on sidewalls of the gates, and the sidewalls 316 and 317 are formed. Arsenic with a dose amount of $5\times10^{15}/cm^2$ is ion-implanted in the region of the n-channel MOS transistor by using the side walls as masks to thereby form n-type impurity regions (source and drain regions) 320. Further, as shown in FIG. 11B, boron (B) is ion-implanted in the region of the p-channel MOS transistor to thereby form p-type impurity regions (source and drain regions) 324.

Then, the silicon oxide film remaining on the n-type impurity regions (the source and drain regions) 320 and on the p-type impurity regions (the source and drain regions) 324 is removed by etching to thereby form an interlayer insulating film 325 on the entire surface. A leveling film formed of phosphorous glass (PSG), boron glass (BSG) or phosphorous-boron glass (PBSG) may be formed thereon, and reflowing may be conducted to improve levelness.

Thereafter, a heating process is conducted for activation of the impurity elements that are ion-implanted. The heating process is conducted with PPTA by using the heat treatment apparatus of the present invention, and activation is performed by irradiating pulse light plural times. The pulse light is irradiated from one surface or both surfaces of the substrate with a tungsten halogen lamp as a light source. In this heating process as well, the flow rate of He is increased or decreased in synchronization with turning-on/turning-off of the tungsten halogen lamp to make the semiconductor substrate to be selectively heated.

A heating temperature is set with a temperature of a temperature detection means, which is used as a monitor, as a standard, and the emission intensity of the light source is controlled such that the maximum temperature is 700 to 1000° C., preferably 950° C. With this heating process, the impurities are activated, and the impurity regions where the source and the drain are formed are made to have low resistance.

Further, a hydrogenation process is a process necessary for improving characteristics, and can be conducted by a method of conducting a heating process in a hydrogen atmosphere or a method of conducting a plasma process. The interlayer insulating film is formed of a silicon nitride film, and the heating process is conducted at 350 to 500° C., whereby hydrogen in the silicon nitride film 320 is emitted. The hydrogen is diffused into the semiconductor to be hydrogenated, and defects can be compensated.

Then, contact holes, which reach the n-type impurity regions (the source and drain regions) 320 and the p-type impurity regions (the source and drain regions) 324, are formed in the interlayer insulating film 325, and wirings 326 and 327 are formed. There is no limitation on the material used for the wirings but aluminum (Al) generally used as a low resistance material may be preferably used. Also, a lamination structure of Al and titanium (Ti) may be adopted.

Thus, an n-channel MOS transistor 331 and a p-channel MOS transistor 330 are completed. The structure of the transistor described in this embodiment is merely one embodiment, and it is not necessary that the present invention is limited to the manufacturing process and the structures shown in FIGS. 10A to 11C. A CMOS circuit, an NMOS circuit and a PMOS circuit can be formed by using the above transistors. Further, various circuits such as a shift register circuit, a buffer circuit, a sampling circuit, a D/A converter circuit and a latch circuit can be formed, and semiconductor devices such as a memory, a CPU, a gate array and an RISC can be manufactured. The above circuits enable an operation at high speed by being composed of MOSs. Further, low power consumption can be realized with a driving voltage of 3 to 5 V.

Embodiment 3

In this embodiment, an embodiment of a manufacturing process of a MOS transistor using a salicide technique by using the heat treatment apparatus of the present invention is described.

Figure 12A:
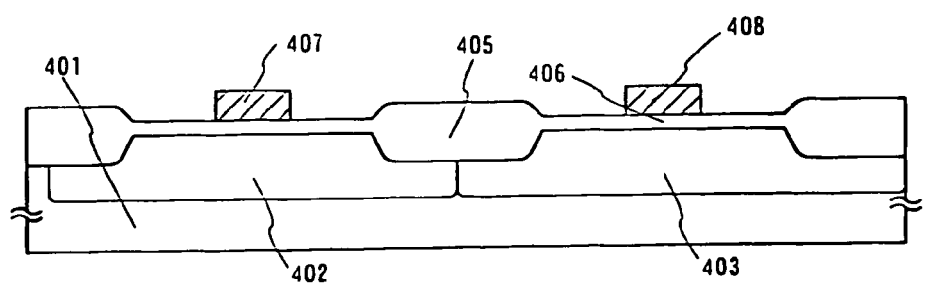
FIGS. 12A to 12C are diagrams explaining a manufacturing process of a MOS transistor.

In FIG. 12A, the same substrate as that in Embodiment 1 is used as a substrate 401, and an n-well 402 and a p-well 403 are formed with one mask in a self-aligning manner. Further, a field oxide film 405 is formed. Then, a silicon oxide film 406 that becomes a gate insulating film is formed by a thermal oxidization method. Gates 407 and 408 are formed of a polycrystalline silicon film added with an n-type impurity typified by phosphorous at a high concentration.

Figure 12B:
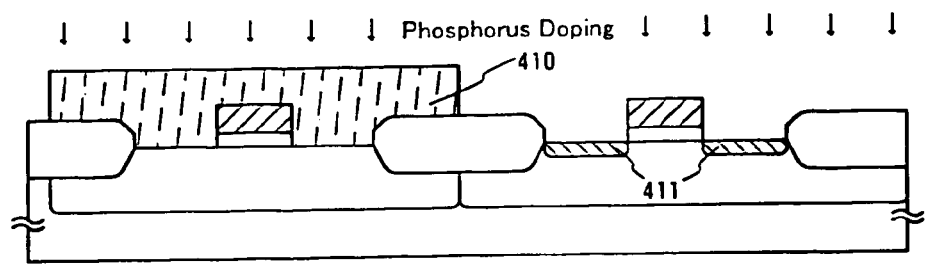
Figure 12C:
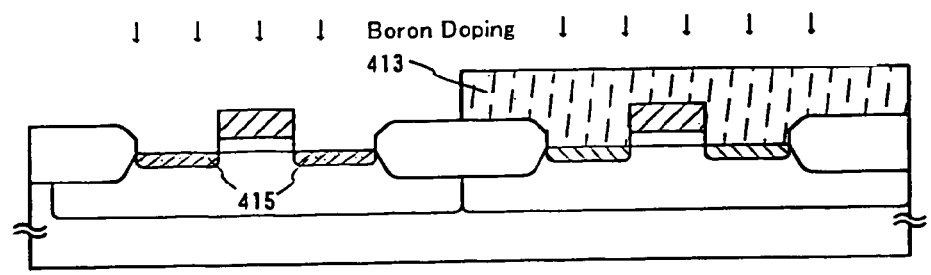

Next, as shown in FIGS. 12B and 12C, impurity elements respectively imparting an n-type conductivity and a p-type conductivity are added in order to form low concentration drain (LDD) regions in an n-channel MOS transistor and a p-channel MOS transistor. This may be conducted by an ion doping method or an ion injection method. Phosphorous (P) is ion-implanted to the n-channel MOS transistor, and boron (B) is ion-implanted to the p-channel MOS transistor. The dose amount is set to $1 \times 10^{13}/cm^2$. Ion injection is conducted using the gates as masks, and n-type impurity regions 411 added with phosphorous (P) and p-type impurity regions 415 added with boron (B) can be formed in the region where the n-channel MOS transistor is formed and the region where the p-channel MOS transistor is formed, respectively, in a self-aligning manner.

Thereafter, an insulating film such as a silicon oxide film or a silicon nitride film is formed by conducting a CVD method on the entire surface, and this film is etched by an anisotropic dry etching to form side walls 416 and 417 on side walls of the gates 407 and 408 as shown in FIG. 13A. Then, a resist mask 419 is formed, and boron (B) is ion-implanted to the region where the p-channel MOS transistor is formed to form p-type impurity regions 420. The p-type impurity regions 420 are formed to have a depth deeper than that of the p-type impurity regions 415 with an acceleration voltage of 50 to 100 keV.

As shown in FIG. 13B, after the resist mask 419 is removed, a metal 421 such as Ti, Mo or Cr is formed over the surface. Ti is typically used, and it is formed over the entire surface with a thickness of 50 to 1000 nm by a sputtering method. Thereafter, a heating process is conducted at 600 to 800° C., preferably 650 to 750° C. to form titanium silicide. The titanium silicide is formed at a portion where a Ti film and silicon contact with each other in a self-aligning manner. The Ti film remaining after the heating process is selectively etched, whereby titanium silicide layers 423 to 426 are formed as shown in FIG. 13C. However, a high resistant phase is formed in the titanium silicide film formed at a temperature of 800° C. or less. Lamp light turned on in a pulse shape is irradiated plural times by using the heat treatment apparatus of the present invention to conduct a heating process substantially at approximately 900° C. for about 5 to 60 seconds, whereby a low resistant phase can be formed. By forming titanium silicide as described above, the sheet resistance of the gate and the p-type or n-type impurity region can be obtained at 2 to 4 $\Omega/\square$.

Then, a resist mask 429 is formed in the region where the p-channel MOS transistor is formed, and arsenic is injected with a dose amount of $5 \times 10^{15}/cm^2$ and with an acceleration voltage of 50 to 120 keV in the region of the n-channel MOS transistor by using the side walls and the gates as masks to form n-type impurity regions 430. These impurity regions are also formed to have a depth deeper than that of the n-type impurity regions 411.

Then, as shown in FIG. 13D, an interlayer insulating film 432 is formed using silicon oxide or the like. Thereafter, a heating process is conducted at 700 to 900° C. for activation of the ion-implanted impurity elements. The heating process is also conducted with PPTA by using the heat treatment apparatus of the present invention as in Embodiment 2. The process method and the process condition may be the same as in Embodiment 2, and thus are omitted here. Thus, the impurities are activated, and the impurity regions where the source and the drain are formed are made to have low resistance.

Then, contact holes are formed in the interlayer insulating film 432 and wirings 434 and 435 are formed of a film of Al or a lamination film of Ti and Al. If a heating process is conducted in an atmosphere containing hydrogen at 300 to 500° C., preferably 350 to 450° C. in this state, characteristics of the transistor can be made more preferable.

From the above, a p-channel MOS transistor 440 and an n-channel MOS transistor 441 can be formed on the semiconductor substrate by using the salicide technique. A CMOS circuit, an NMOS circuit and a PMOS circuit can be formed using the above transistors. Further, various circuits such as a shift register circuit, a buffer circuit, a sampling circuit, a D/A converter circuit and a latch circuit can be formed, and semiconductor devices such as a memory, a CPU, a gate array and an RISC can be manufactured. The above circuits enable an operation at high speed by being composed of MOSs. Further, low power consumption can be realized with a driving voltage of 3 to 5 V.

As described above, by using the heat treatment apparatus of the present invention, the heating process with the purpose of activating the impurity elements added to the semiconductor substrate and improving contact resistance of an electrode can be performed for a short time.

Further, the turn-on time period per time of lightening by the light source is set to 0.1 to 60 seconds, preferably 0.1 to 20 seconds, light from the light source is irradiated plural times, and the time period for holding the maximum temperature of the semiconductor substrate is set to 0.5 to 5 seconds. Further, the supply amount of the coolant is increased or decreased with turning-on/turning-off of the light source. Thus, the heat treatment effect of the semiconductor substrate is enhanced, and also, the damage on the layer with low heat-resistance, which is formed on the semiconductor substrate, can be prevented.

Furthermore, the above heating process is conducted under the reduced pressure Thus, the oxygen concentration in an atmosphere is reduced, and oxidization of the surface of the semiconductor substrate is suppressed to promote activation of the impurities. Therefore, the heating process with high reproducibility can be conducted.

What is claimed is:

1. A method of manufacturing a semiconductor device comprising the steps of:
    introducing a coolant into a processing chamber in which a semiconductor substrate is placed; and
    irradiating the semiconductor substrate with light emitted from a light source;
    wherein a supply amount of the coolant in the processing chamber is decreased while the semiconductor substrate is irradiated with the light by turning the light source on,
    wherein the supply amount of the coolant in the processing chamber is increased while turning the light source off.

2. A method of manufacturing a semiconductor device according to claim 1, wherein the coolant is one selected from the group consisting of nitrogen, helium, argon, krypton and xenon.

3. A method of manufacturing a semiconductor device according to claim 1, wherein the light source is one selected from the group consisting of a halogen lamp, a metal halide lamp, a high-pressure mercury-vapor lamp, a high-pressure sodium-vapor lamp and a xenon lamp.

4. A method of manufacturing a semiconductor device comprising the steps of:
    adding an impurity of one conductivity type into a semiconductor substrate;
    introducing a coolant into a processing chamber in which the semiconductor substrate is placed; and
    irradiating the semiconductor substrate with light emitted from a light source;
    wherein a supply amount of the coolant in the processing chamber is decreased while the semiconductor substrate is irradiated with the light by turning the light source on;
    wherein the supply amount of the coolant in the processing chamber is increased while turning the light source off.

5. A method of manufacturing a semiconductor device according to claim 4, wherein the coolant is one selected from the group consisting of nitrogen, helium, argon, krypton and xenon.

6. A method of manufacturing a semiconductor device according to claim 4, wherein the light source is one selected from the group consisting of a halogen lamp, a metal halide lamp, a high-pressure mercury-vapor lamp, a high-pressure sodium-vapor lamp and a xenon lamp.

7. A method of manufacturing a semiconductor device comprising the steps of:
    first irradiating a light to a semiconductor substrate in a processing chamber by turning a light source on;
    first cool treating the semiconductor substrate by flowing a coolant into the processing chamber while turning the light source off;
    second irradiating the light to the semiconductor substrate in the processing chamber by turning the light source on; and
    second cool treating the semiconductor substrate by flowing the coolant into the processing chamber while turning the light source off.

8. A method of manufacturing a semiconductor device according to claim 7, wherein the coolant is one selected from the group consisting of nitrogen, helium, argon, krypton and xenon.

9. A method of manufacturing a semiconductor device comprising the steps of:
    first irradiating a light to a semiconductor substrate by turning a light source on while a supply amount of a coolant is decreased;
    first cool treating the semiconductor substrate by increasing the supply amount of the coolant into a processing chamber while turning the light source off;
    second irradiating the light to the semiconductor substrate by turning the light source on while the supply amount of the coolant is decreased; and
    second cool treating the semiconductor substrate by increasing the supply amount of the coolant into the processing chamber while turning the light source off.

10. A method of manufacturing a semiconductor device according to claim 9, wherein the coolant is one selected from the group consisting of nitrogen, helium, argon, krypton and xenon.

11. A method of manufacturing a semiconductor device comprising the steps of:
    introducing a coolant into a processing chamber in which a semiconductor substrate is placed; and
    irradiating the semiconductor substrate with light emitted from a light source;
    wherein a supply amount of the coolant in the processing chamber is decreased while the semiconductor substrate is irradiated with the light by turning the light source on with an emission time of the light being 0.1 to 60 seconds per emission,
    wherein the supply amount of the coolant in the processing chamber is increased while turning the light source off.

12. A method of manufacturing a semiconductor device according to claim 11, wherein the coolant is one selected from the group consisting of nitrogen, helium, argon, krypton and xenon.

13. A method of manufacturing a semiconductor device according to claim 11, wherein the light source is one selected from the group consisting of a halogen lamp, a metal halide lamp, a high-pressure mercury-vapor lamp, a high-pressure sodium-vapor lamp and a xenon lamp.

14. A method of manufacturing a semiconductor device comprising the steps of:
- adding an impurity of one conductivity type into a semiconductor substrate;
- introducing a coolant into a processing chamber in which the semiconductor substrate is placed; and
- irradiating the semiconductor substrate with light emitted from a light source;
- wherein a supply amount of the coolant in the processing chamber is decreased while the semiconductor substrate is irradiated with the light by turning the light source on with an emission time of the light being 0.1 to 60 seconds per emission;
- wherein the supply amount of the coolant in the processing chamber is increased while turning the light source off.

15. A method of manufacturing a semiconductor device according to claim 14, wherein the coolant is one selected from the group consisting of nitrogen, helium, argon, krypton and xenon.

16. A method of manufacturing a semiconductor device according to claim 14, wherein the light source is one selected from the group consisting of a halogen lamp, a metal halide lamp, a high-pressure mercury-vapor lamp, a high-pressure sodium-vapor lamp and a xenon lamp.

17. A method of manufacturing a semiconductor device comprising the steps of:
- first irradiating a light to a semiconductor substrate in a processing chamber by turning a light source on with an emission time of the light being 0.1 to 60 seconds per emission;
- first cool treating the semiconductor substrate by flowing a coolant into the processing chamber while turning the light source off;
- second irradiating the light to the semiconductor substrate in the processing chamber by turning the light source on with an emission time of the light being 0.1 to 60 seconds per emission; and
- second cool treating the semiconductor substrate by flowing the coolant into the processing chamber while turning the light source off.

18. A method of manufacturing a semiconductor device according to claim 17, wherein the coolant is one selected from the group consisting of nitrogen, helium, argon, krypton and xenon.

19. A method of manufacturing a semiconductor device comprising the steps of:
- first irradiating a light to a semiconductor substrate by turning a light source on with an emission time of the light being 0.1 to 60 seconds per emission while a supply amount of a coolant is decreased;
- first cool treating the semiconductor substrate by increasing the supply amount of the coolant into a processing chamber while turning the light source off;
- second irradiating the light to the semiconductor substrate by turning the light source on with an emission time of the light being 0.1 to 60 seconds per emission while the supply amount of the coolant is decreased; and
- second cool treating the semiconductor substrate by increasing the supply amount of the coolant into the processing chamber while turning the light source off.

20. A method of manufacturing a semiconductor device according to claim 19, wherein the coolant is one selected from the group consisting of nitrogen, helium, argon, krypton and xenon.

* * * * *